US012813055B2

(12) United States Patent
Li et al.

(10) Patent No.: US 12,813,055 B2
(45) Date of Patent: Nov. 24, 2026

(54) MONOLITHIC, CASCADED, MULTIPLE COLOR LIGHT-EMITTING DIODES WITH INDEPENDENT JUNCTION CONTROL

(71) Applicant: The Regents of the University of California, Oakland, CA (US)

(72) Inventors: Panpan Li, Goleta, CA (US); Hongjian Li, Goleta, CA (US); Shuji Nakamura, Santa Barbara, CA (US); Steven P. DenBaars, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 493 days.

(21) Appl. No.: 18/263,566

(22) PCT Filed: Feb. 22, 2022

(86) PCT No.: PCT/US2022/017241
§ 371 (c)(1),
(2) Date: Jul. 31, 2023

(87) PCT Pub. No.: WO2022/178393
PCT Pub. Date: Aug. 25, 2022

(65) Prior Publication Data

US 2024/0371912 A1 Nov. 7, 2024

Related U.S. Application Data

(60) Provisional application No. 63/168,688, filed on Mar. 31, 2021, provisional application No. 63/151,951, filed on Feb. 22, 2021.

(51) Int. Cl.
*H10H 29/10* (2025.01)
*H10H 20/01* (2025.01)
(Continued)

(52) U.S. Cl.
CPC ........ *H10H 29/10* (2025.01); *H10H 20/0137* (2025.01); *H10H 20/812* (2025.01); *H10H 20/825* (2025.01)

(58) Field of Classification Search
CPC ...... H10H 29/10; H10H 29/14; H10H 20/813; H10H 20/811
See application file for complete search history.

(56) References Cited

U.S. PATENT DOCUMENTS

2009/0078955 A1 3/2009 Fan et al.
2011/0220871 A1 9/2011 Kamikawa et al.
(Continued)

FOREIGN PATENT DOCUMENTS

EP 4086964 11/2022
WO 2022035934 2/2022

OTHER PUBLICATIONS

PCT International Search Report and Written Opinion dated Jun. 3, 2022 for PCT Application No. PCT/US2022/017241.
(Continued)

*Primary Examiner* — Douglas M Menz
(74) *Attorney, Agent, or Firm* — GATES & COOPER LLP

(57) ABSTRACT

A method of fabricating a plurality of monolithic, cascaded, multiple color III-nitride light-emitting diodes (LEDs) with independent junction control, wherein: each of the LEDs is comprised of at least an n-type III-nitride layer, a III-nitride emitting layer, and a p-type III-nitride layer; at least two of the LEDs are separated by an n-type tunnel junction (TJ) insertion layer grown by selective area growth on or above the p-type III-nitride layer of one of the LEDs; the p-type III-nitride layer of one of the LEDs and the n-type tunnel junction insertion layer form a tunnel junction; and the
(Continued)

p-type III-nitride layer of one of the LEDs is at least partially covered by the n-type tunnel junction insertion layer.

20 Claims, 15 Drawing Sheets

(51) Int. Cl.
*H10H 20/812* (2025.01)
*H10H 20/825* (2025.01)

(56) References Cited

U.S. PATENT DOCUMENTS

| | | | | |
|---|---|---|---|---|
| 2011/0240955 | A1 | 10/2011 | Windisch et al. | |
| 2012/0205620 | A1 | 8/2012 | Sato et al. | |
| 2013/0270514 | A1 | 10/2013 | Saxler | |
| 2015/0131259 | A1 | 5/2015 | Ouderkirk et al. | |
| 2017/0323788 | A1 | 11/2017 | Mi et al. | |
| 2019/0207043 | A1 | 7/2019 | Yonkee et al. | |
| 2019/0245112 | A1 | 8/2019 | Alhassan et al. | |
| 2020/0287080 | A1 | 9/2020 | Kim | |
| 2022/0285578 | A1* | 9/2022 | Kim | H10H 29/10 |

OTHER PUBLICATIONS

Extended European Search Report dated Nov. 26, 2024 for European Patent Application No. 22757094.2.
European Examination Report dated Jan. 30, 2026 for European Patent Application No. 22757094.2.

* cited by examiner

MONOLITHIC, CASCADED, MULTIPLE COLOR LIGHT-EMITTING DIODES WITH INDEPENDENT JUNCTION CONTROL

CROSS REFERENCE TO RELATED APPLICATIONS

This application claims the benefit under 35 U.S.C. Section 119 (e) of the following and commonly-assigned applications:

U.S. Provisional Application Ser. No. 63/151,951, filed on Feb. 22, 2021, by Panpan Li, Hongjian Li, Shuji Nakamura and Steven P. DenBaars, entitled "CASCADED MULTIPLE LIGHT-EMITTING DIODES WITH INDEPENDENT JUNCTION CONTROL"; and U.S. Provisional Application Ser. No. 63/168,688, filed on Mar. 31, 2021, by Panpan Li, Hongjian Li, Shuji Nakamura and Steven P. DenBaars, entitled "EPITAXY GROWTH OF MONOLITHIC, FULL-COLOR LIGHT EMITTING DIODES";

which applications are incorporated by reference herein.

BACKGROUND OF THE INVENTION

1. Field of the Invention

This invention relates to a method of fabricating monolithic, cascaded, multiple color light-emitting diodes (LEDs) with independent junction control.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

Current commercial III-nitride light-emitting diodes (LEDs) and laser diodes (LDs) employ the use of an n-type region, an active region where light is generated, and a p-type region, to form a diode. The emission wavelength covers from ultraviolet to red, and even infrared.

However, p-type gallium nitride (p+GaN) is difficult to contact electrically and has low hole concentration and mobility. This means that p+GaN cannot be used as a current spreading layer and that traditional p-contacts will add significant voltage to devices. Despite these inherent problems, all current commercial III-nitride light emitting devices utilize traditional p-contacts and materials other than p+GaN for current spreading, which typically comprise transparent conducting oxides (TCO), such as indium tin oxide (ITO).

A low resistance tunnel junction (TJ) on top of p+GaN would allow for current spreading in n-type GaN (n−GaN) on both sides of the device, as well as the use of low resistance n-type contacts on both sides of the device. A tunnel junction is a diode comprised of a very highly doped (n+/p+) interface that allows for electrons to tunnel between the valence band and conduction band. This was first demonstrated by Esaki [1] in highly-doped germanium (Ge) homojunctions with very thin depletion regions. However, GaN is a wide bandgap semiconductor, so the barrier for tunneling is high.

Several approaches to reducing the tunneling barrier have been attempted, including bandgap engineering via polarization with aluminum nitride (AlN) interlayers [2], reducing the bandgap with an indium gallium nitride (InGaN) interlayer [3], and introducing defect states via interfacial gadolinium nitride (GdN) nanoparticles [4]. However, all these approaches are associated with reduced device performance, either in terms of voltage or resistance increases, or optical losses.

In another example, magnesium (Mg) doped p+GaN grown by metal organic chemical vapor deposition (MOCVD) is compensated by hydrogen as grown, and it must be annealed after growth to remove the hydrogen. This anneal can only work if the p+GaN is not covered by n−GaN, as hydrogen cannot easily diffuse through n−GaN. [5] This limits the effectiveness of GaN tunnel junctions and prevents their widespread use.

III-nitride based micro-sized LEDs (also referred to as μLEDs), which are LEDs having device areas less than about 10,000 (100×100) $\mu m^2$, are promising candidates for next-generation display applications, including near-eye displays and heads-up displays. μLEDs are characterized by their small size, as compared to standard LEDs, which are typically more than about 10,000 $\mu m^2$. Employing the use of III-nitride μLEDs with tunnel junctions enables the realization to cascade μLEDs with different emission colors, such as blue, green, and red.

Monolithic, cascaded, multiple μLEDs with independent junction control would enable the realization of full color LEDs in one device on a wafer-scale, such as the integration of blue/green μLEDs or blue/green/red μLEDs in one device. Such technology would offer significant advantages as compared to efforts made to transfer and assemble of millions of μLEDs in one display.

Although high brightness and high efficiency blue and green InGaN LEDs have been achieved, GaN-based μLEDs face several challenges.

First, the efficiency of GaN-based μLEDs reduces as the area of μLEDs decreases, due to nonradiative surface recombination losses and sidewall damage. [3] In particular, GaN-based μLEDs with a size less than 10×10 $\mu m^2$ show a very low external quantum efficiency (EQE).

Second, the EQE of red GaN-based μLEDs (~620 nm) remains very poor. Conventional red AlGalnP-based LEDs show a high EQE with a regular size, but as the size shrinks to μLEDs scale, the EQE decreases dramatically due to a much higher surface recombination velocity. Meanwhile, the EQE in red InGaN-based μLEDs remains low, which is caused by the quantum-confinement Stark effect (QCSE) and a high defect density in InGaN quantum wells (QWs) with a high indium composition over 30%. Moreover, it is very challenging to transfer and assemble millions of RGB μLEDs for full-color display applications.

Thus, there is a need in the art for improved methods of fabricating III-nitride μLEDs with tunnel junctions that would enable the realization of monolithic, cascaded, multiple color μLEDs. The present invention satisfies this need.

SUMMARY OF THE INVENTION

To overcome the limitations of the prior art described above, the present invention discloses a method for fabricating monolithic, cascaded, multiple color LEDs by epitaxial growth, with independent junction control, wherein LEDs with emission wavelengths of blue and green or blue, green, and red are connected by tunnel junctions (TJs). A higher growth temperature for an n-type III-nitride layer than the TJs is used to reduce defect density. After growth of the LEDs, a surface treatment is performed to remove residual Mg. A p-type III-nitride layer for one or more of the LEDs is activated after exposing access points by etching a mesa. Contact layers or pads are deposited on the exposed access points, so that the LEDs with different emission wavelengths can be independently controlled. Experimental results have demonstrated realization of the monolithic, cascaded, multiple color LEDs in one wafer, which have blue and green emissions, or blue, green, and red emissions.

Specifically, the present invention discloses a method of fabricating a plurality of monolithic, cascaded, multiple color III-nitride light-emitting diodes (LEDs) with independent junction control, wherein: each of the LEDs is comprised of at least an n-type III-nitride layer, a III-nitride emitting layer, and a p-type III-nitride layer; at least two of the LEDs are separated by an n-type tunnel junction (TJ) insertion layer grown by selective area growth on or above the p-type III-nitride layer of one of the LEDs; the p-type III-nitride layer of one of the LEDs and the n-type tunnel junction insertion layer form a tunnel junction; and the p-type III-nitride layer of one of the LEDs is at least partially covered by the n-type tunnel junction insertion layer.

The III-nitride emitting layer is comprised of one or more $In_xAl_yGa_zN$ quantum wells (QWs), where $x+y+z=1$, $0\leq x\leq 1$, $0\leq y\leq 1$, and $0\leq z\leq 1$. An emission wavelength of each of the LEDs is controlled by an indium composition in the III-nitride emitting layer. The III-nitride emitting layer of each of the LEDs has a different indium composition and a different emission wavelength. The plurality of monolithic, cascaded, multiple color III-nitride LEDs comprise blue and green LEDs or blue, green, and red LEDs.

The p-type III-nitride layer of one or more of the LEDs is at least partially exposed by etching to create one or more access points. The p-type III-nitride layer of the one or more of the LEDs is activated by thermal annealing to remove hydrogen through sidewalls of the p-type III-nitride layer of one or more of the LEDs at least partially exposed by the etching. The one or more of the LEDs includes one or more contact layers or pads for injection of current that controls emission of the one or more of the LEDs independently, wherein the contact layers or pads are deposited on one or more of the access points.

A surface treatment is used after epitaxial growth of each of the LEDs, and the surface treatment is performed using hydrochloric (HCL) acid, aqua regia and/or hydrogen fluoride (HF).

The LEDs are micro-sized LEDs, wherein an emitting area of each of the LEDs is less than about 10,000 $\mu m^2$.

BRIEF DESCRIPTION OF THE DRAWINGS

Referring now to the drawings in which like reference numbers represent corresponding parts throughout.

DETAILED DESCRIPTION OF THE INVENTION

Figure 1:
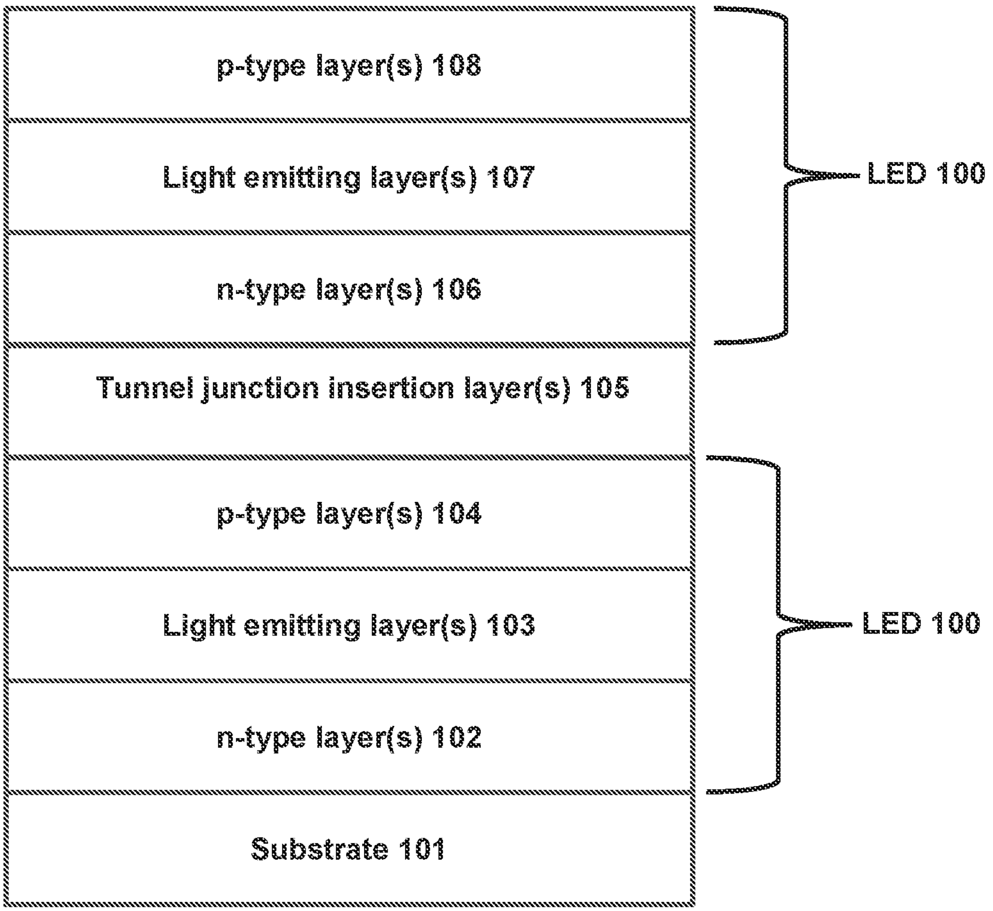
FIG. 1 is a cross-sectional side-view schematic of two monolithic, cascaded, multiple color LEDs with independent junction control and a tunnel junction connection.

In the following description of the preferred embodiment, reference is made to the accompanying drawing which forms a part hereof, and in which is shown by way of illustration a specific embodiment in which the invention may be practiced. It is to be understood that other embodiments may be utilized, and structural changes may be made without departing from the scope of the present invention.

Overview

The present invention describes a method for fabricating monolithic, cascaded, multiple color LEDs with independent junction control, and the resulting devices. Specifically, III-nitride light-emitting device structures incorporating one or more TJs are fabricated using MOCVD. The monolithic, cascaded, multiple color LEDs with independent junction control enables the realization of blue/green and/or blue/green/red LEDs integrated in one device.

One embodiment of the present invention is a III-nitride semiconductor device comprised of a III-nitride blue LED, a TJ, and a III-nitride green LED. A surface treatment is carried out before the growth of the TJ. An access point to the TJ are fabricated by selectively etching a portion of an n-type III-nitride TJ junction layer to partially expose a p-type III-nitride layer. The etching can be performed by reactive ion etching (RIE), inductively coupled plasma (ICP) etching, or wet etching with an appropriate chemistry, or a combination thereof. The p-type III-nitride layer is activated by annealing at a temperature of 700° C. to remove hydrogen through sidewalls exposed by the etching. Ohmic contact layers or pads are formed on the access points to control the injection current path, in order to control the blue/green LEDs independently.

Another embodiment of the present invention is a III-nitride semiconductor device comprised of a III-nitride blue LED, a TJ, a III-nitride green LED, a TJ, and a III-nitride red LED. The access points to the TJs can be fabricated by selectively etching a portion of the n-type III-nitride TJ layer to partially expose the p-type III-nitride layer. Again, the etching can be performed by RIE, ICP etching, or wet etching with an appropriate chemistry, or a combination thereof. Ohmic contact layers or pads are formed on the access points to control the injection current path, in order to control blue/green/red LEDs independently.

The TJs can be grown using selective area growth (SAG) by MOCVD, wherein a dielectric, such as $SiO_2$, SiN, or other Si containing material, may be patterned onto the p-type III-nitride layer. The pattern may be comprised of circles, squares, stripes, hexagons, or other geometric shapes, or combinations of shapes, that are used to create the access points. A n-type TJ insertion layer is subsequently laminated on top of the dielectric and the exposed p-type III-nitride layer by the selective area growth. The dielectric is afterward removed from the p-type III-nitride layer, thus leaving a partially exposed p-type III-nitride layer by means of the access points.

By forming a highly-doped n-type TJ insertion junction layer that partially covers the p-type III-nitride layer, the operating voltage of these III-nitride devices can be reduced and their efficiency can be increased. This invention also enables new types of device structures, including new types of light-emitting diodes, laser diodes, vertical cavity surface emitting lasers, solar cells, and photodetectors.

TECHNICAL DESCRIPTION

First Embodiment

FIG. 1 is a cross-sectional side-view schematic of a device structure, according to a first embodiment of the present invention. The device structure comprises two LEDs 100, which are formed on a substrate 101, upon which is deposited successively in the following order: an n-type GaN layer 102 doped with Si, a light-emitting layer 103 comprising an $In_xGa_{(1-x)}N$/GaN multiple quantum well (MQW) structure, a p-type GaN layer 104 doped with Mg, an n-type TJ insertion layer 105, an n-type GaN layer 106 doped with Si, a light-emitting layer 107 comprising an $In_yGa_{(1-y)}N$/GaN MQW structure, and a p-type GaN layer 108 doped with Mg.

The interface between the p-type GaN layer 104 doped with Mg and the n-type TJ insertion layer 105 form a TJ. In one embodiment, the n-type TJ insertion layer 105 comprises n-InGaN/n+GaN.

A first LED 100 is comprised of the III-nitride light emitting layer 103 comprised of at least one MQW structure sandwiched between the n-type III-nitride layer 102 and p-type III-nitride layer 104. A second LED 100 is comprised of the III-nitride light emitting layer 107 comprised of at least one MQW structure sandwiched between the n-type III-nitride layer 106 and p-type III-nitride layer 108.

The emission wavelengths of the LEDs 100 are controlled by the indium compositions x and y. By controlling the indium compositions x and y, monolithic, cascaded LEDs 100 with two emission wavelengths can be integrated in one device.

The n-type GaN layer 102 doped with Si has a thickness greater than 2 μm, and more preferably, 4 μm. The III-nitride light-emitting layer 103 may be comprised of multiple layers of InGaN and GaN, with a total thickness of less than 1 μm, and more preferably, 200 nm. The p-type III-nitride layers 104 may be comprised of multiple layers containing AlGaN and GaN, and can be doped with Mg, wherein these layers 104 comprise a total thickness of less than 1 μm, and more preferably, 120 nm. The n-type TJ insertion layers 105 are comprised of GaN or InGaN doped with Si or Mg with a thickness greater than 0.1 nm, and more preferably, 300 nm. The n-type GaN layer 106 doped with Si has a thickness greater than 2 μm, and more preferably, 4 μm. The III-nitride light-emitting layer 107 may be comprised of multiple layers of InGaN and GaN, with a total thickness of less than 1 μm, and more preferably, 200 nm. The p-type III-nitride layers 108 may be comprised of multiple layers containing AlGaN and GaN, and can be doped with Mg, with a total thickness of less than 1 μm, and more preferably, 120 nm.

Figure 2:
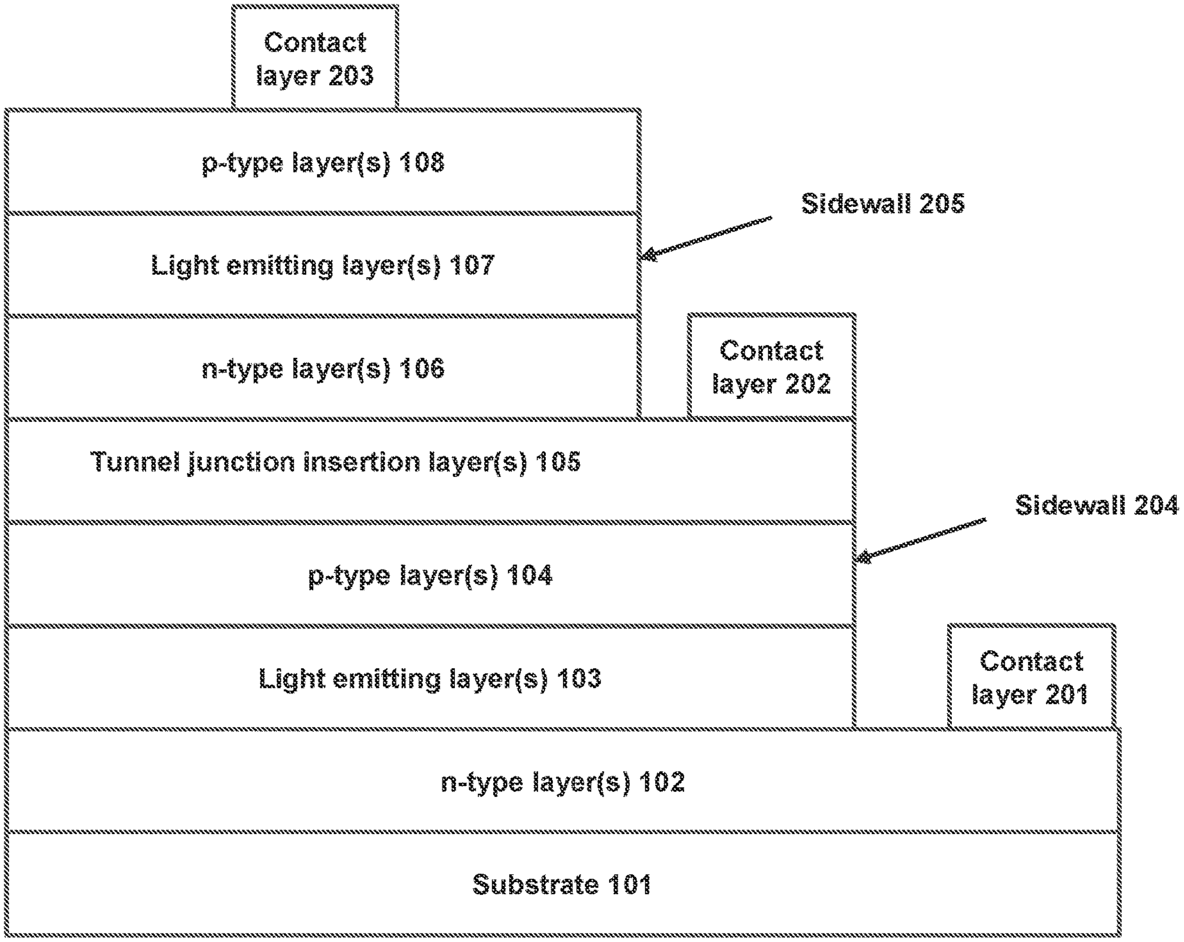
FIG. 2 is a cross-sectional side-view schematic of two monolithic, cascaded, multiple color LEDs with independent junction control and a tunnel junction connection, showing three control pads.

A side view of the device structure after fabrication is shown in FIG. 2. Metal contact layers or pads 201, 202 comprised of Al/Ni/Au are deposited on access points formed by dry etching, such as by ICP or RIE. Metal contact layer or pad 203 is comprised of indium tin oxide (ITO) or Ni/Au.

Sidewalls 204, 205 of the access points are also formed by the dry etching. Rapid thermal annealing (RTA) at 700° C. for 30 mins was employed to re-activate the p-type III-nitride layers 104, 108, by driving out the hydrogen from the sidewalls 204, 205 of the access points.

The end result is monolithic, cascaded, multiple color LEDs 100 with two emission colors that can be integrated into one die with independent junction control.

Second Embodiment

Figure 3:
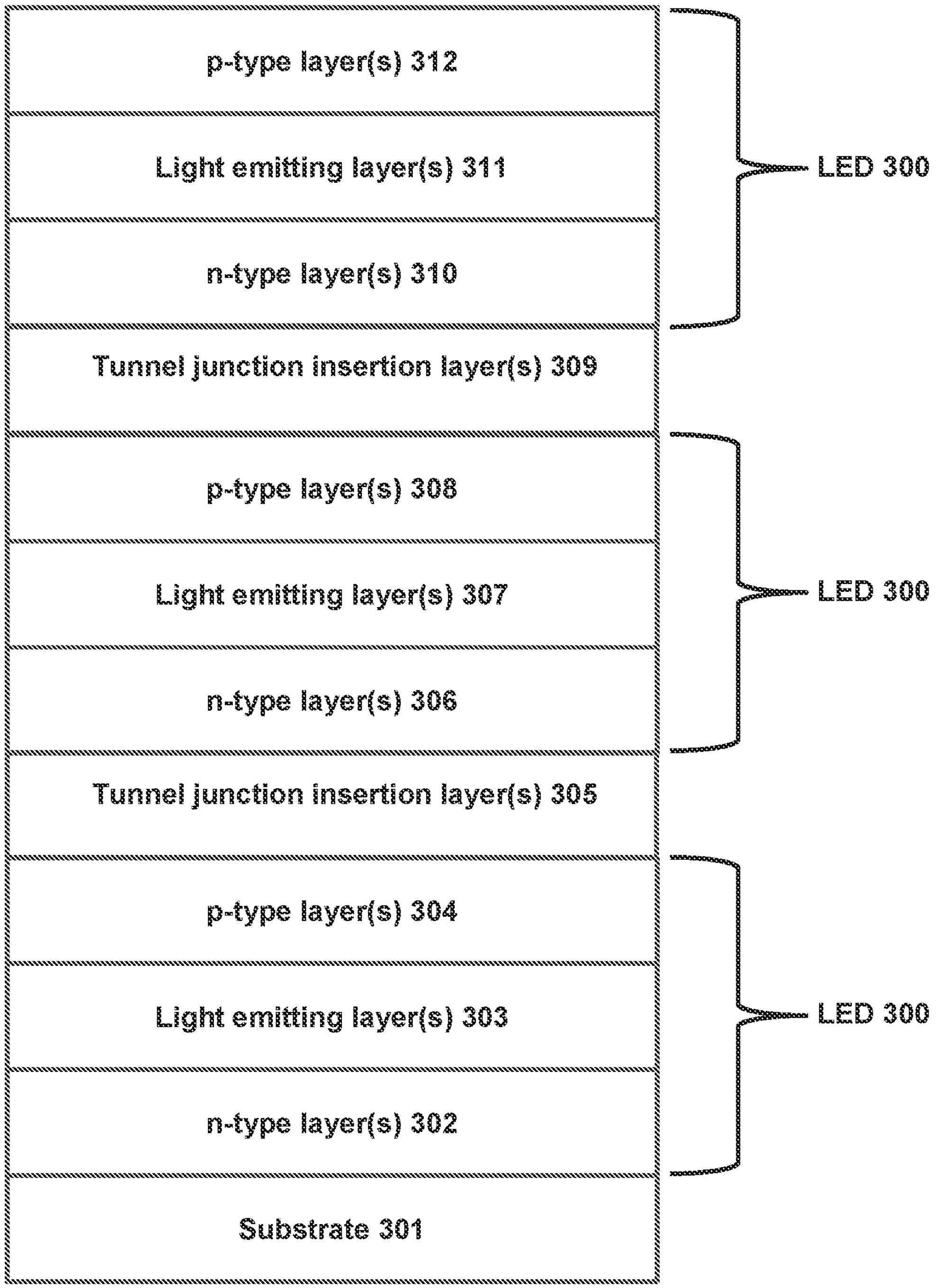
FIG. 3 is a cross-sectional side-view schematic of three monolithic, cascaded, multiple color LEDs with independent junction control and tunnel junction connections.

FIG. 3 is a cross-sectional side-view schematic of a device structure, according to a second embodiment of the present invention. The device structure comprises three LEDs 300, which are formed on a substrate 301, upon which is deposited successively in the following order: an n-type GaN layer 302 doped with Si, a light-emitting layer 303 comprising an $In_xGa_{(1-x)}N$/GaN MQW structure, a p-type GaN layer 304 doped with Mg, an n-type TJ insertion layer 305, an n-type GaN layer 306 doped with Si, a light-emitting layer 307 comprising an $In_yGa_{(1-y)}N$/GaN MQW structure, a p-type GaN layer 308 doped with Mg, an n-type TJ insertion layer 309, an n-type GaN layer 310 doped with Si, a light-emitting layer 311 comprising an $In_zGa_{(1-z)}N$/GaN MQW structure, and a p-type GaN layer 312 doped with Mg.

The interface between the p-type GaN layer 304 doped with Mg and the n-type TJ insertion layer 305 form a TJ. The interface between the p-type GaN layer 308 doped with Mg and the n-type TJ insertion layer 309 also form a TJ.

A first LED 300 is comprised of the III-nitride light emitting layer 303 comprised of at least one MQW structure sandwiched between the n-type III-nitride layer 302 and p-type III-nitride layer 304. A second LED 300 is comprised of the III-nitride light emitting layer 307 comprised of at least one MQW structure sandwiched between the n-type III-nitride layer 306 and p-type III-nitride layer 308. A third LED 300 is comprised of the III-nitride light emitting layer 311 comprised of at least one MQW structure sandwiched between the n-type III-nitride layer 310 and p-type III-nitride layer 312.

The emission wavelengths of the LEDs 300 are controlled by the indium compositions x, y and z. By controlling the indium compositions x, y and z, monolithic, cascaded LEDs 300 with three emission colors can be integrated in one device.

Figure 4:
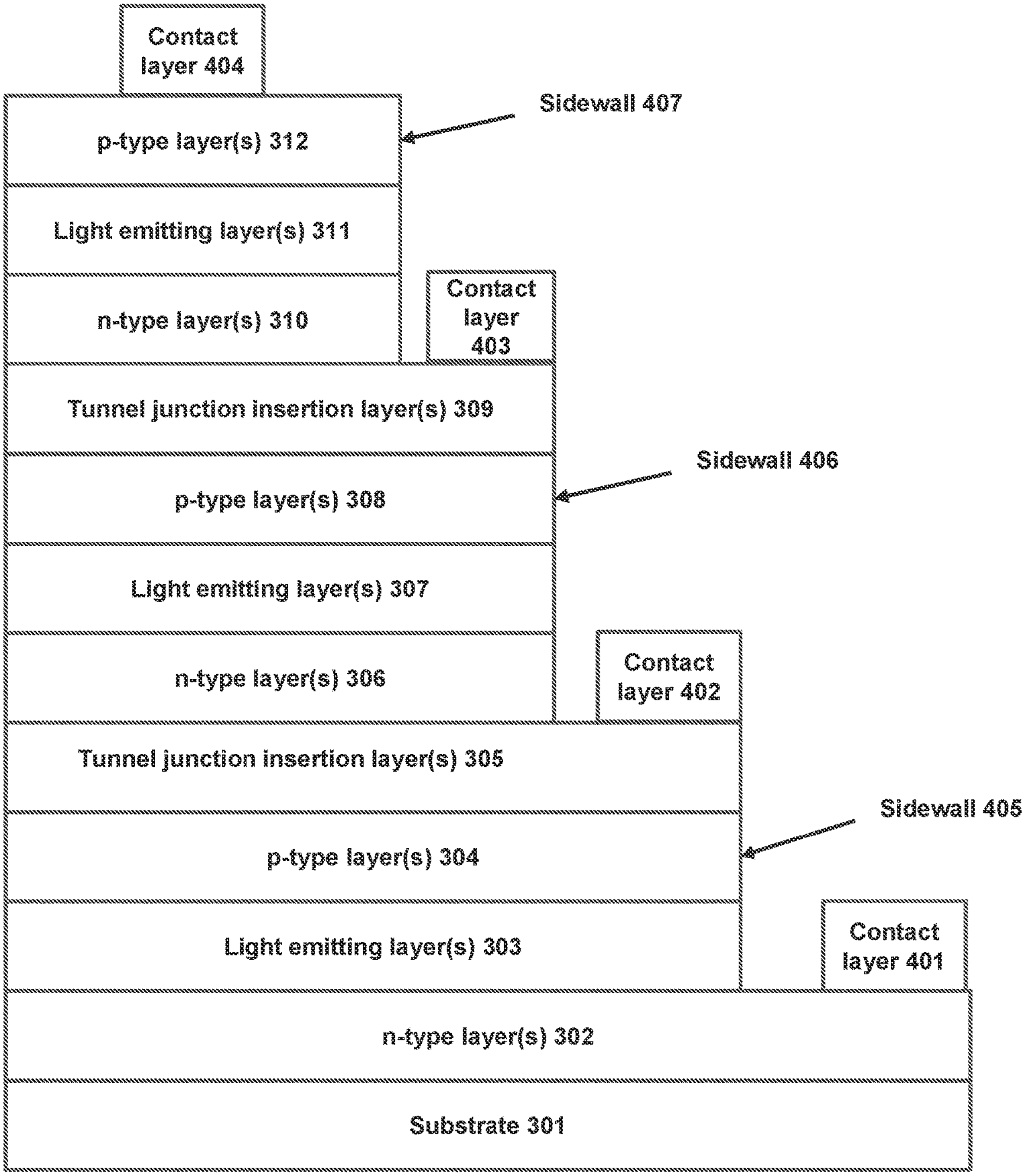
FIG. 4 is a cross-sectional side view schematic of monolithic, cascaded, multiple color LEDs with independent junction control and tunnel junction connections, showing four control pads.

A side view of the devices after fabrication is shown in FIG. 4. Metal contact layers or pads of 401, 402, 403 comprised of Al/Ni/Au are deposited on access points formed by dry etching, such as ICP or RIE. Metal contact layer or pad 404 is comprised of ITO or Ni/Au. Therefore, cascaded LEDs 300 with three emission colors can be integrated in one die with independent junction control.

Sidewalls 405, 406, 407 of the access points are also formed by the dry etching. Rapid thermal annealing (RTA) at 700° C. for 30 mins was employed to re-activate the p-type III-nitride layers 304, 308, 312 by driving out the hydrogen from the sidewalls 405, 406, 407 of the access points.

The end result is monolithic, cascaded, multiple color LEDs 300 with three emission colors that can be integrated into one die with independent junction control.

Process Steps

Figure 5:
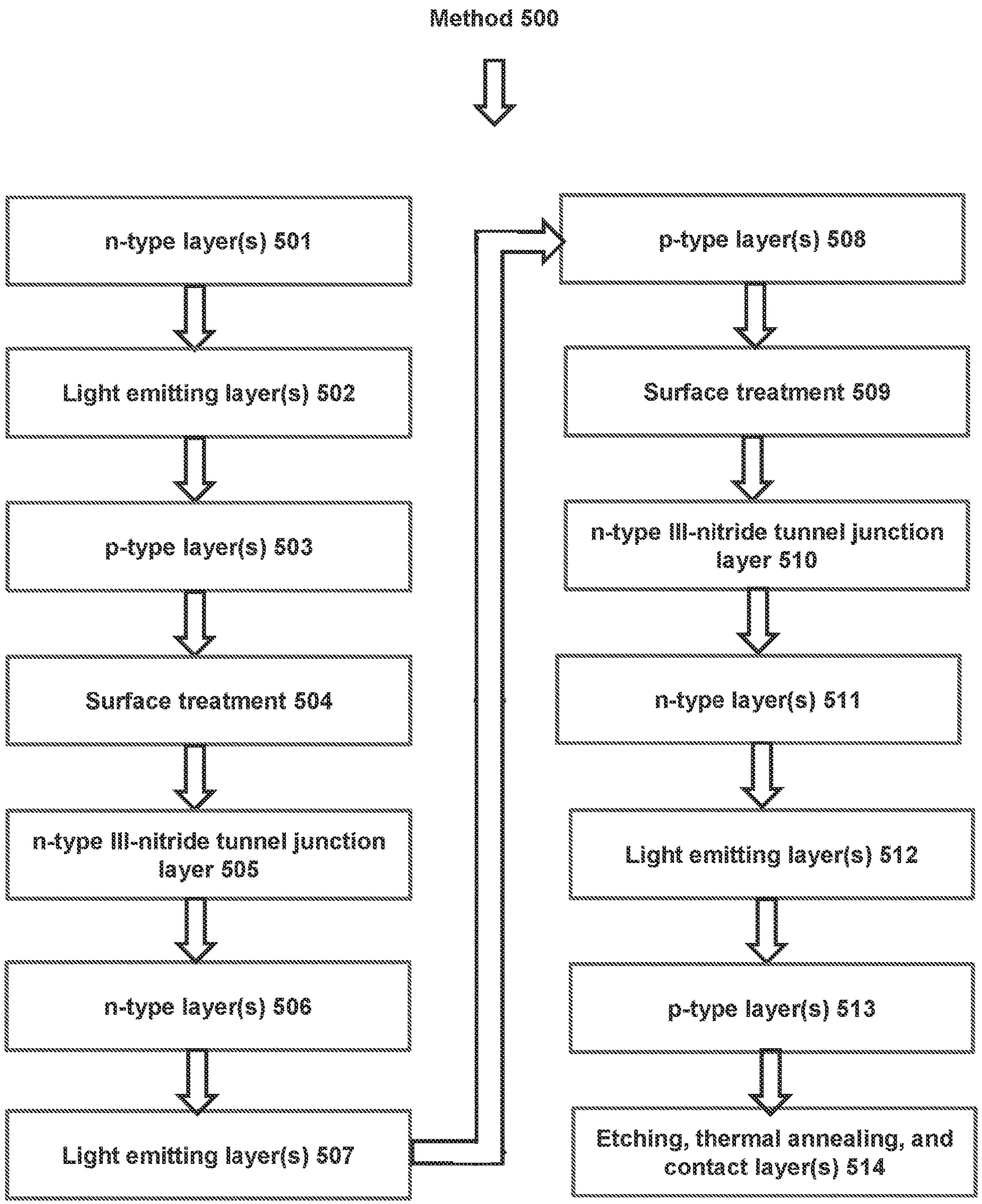
FIG. 5 is a process flow diagram for forming monolithic, cascaded, multiple color LEDs with tunnel junction connections.

FIG. 5 is a process flow diagram for a method 500 of forming monolithic, cascaded, multiple color III-nitride LEDs, according to one embodiment. This process flow diagram may be used to fabricate the device shown in FIGS. 3 and 4. A simplified version of FIG. 5 with fewer steps may be used to fabricate the device shown in FIGS. 1 and 2.

Block 501 represents the step of forming an n-type III-nitride layer; Block 502 represents the step of forming a III-nitride light emitting layer; and Block 503 represents the step of forming a p-type III-nitride layer.

Block 504 represents the step of performing a surface treatment, wherein the surface treatment can include immersing the layers in a reactive chemical such as HCl, HF, or another reactive chemical, and the surface treatments can also include subjecting the layers to a plasma source such as $O_2$ plasma or other plasma sources.

Block 505 represents the step of forming an n-type TJ insertion layer on or above the p-type III-nitride layer. The interface between the p-type III-nitride layer and the n-type TJ insertion layer form a TJ.

Another LED can be grown on or above the n-type TJ insertion junction layer.

Block 506 represents the step of forming an n-type III-nitride layer; Block 507 represents the step of forming a III-nitride light emitting layer; and Block 508 represents the step of forming a p-type III-nitride layer.

Block 509 represents the step of performing a surface treatment, wherein the surface treatment can include immersing the layers in a reactive chemical such as HCl, HF, or another reactive chemical, and the surface treatments can also include subjecting the layers to a plasma source such as $O_2$ plasma or other plasma sources.

Block 510 represents the step of forming an n-type TJ insertion layer on or above the p-type III-nitride layer. The interface between the p-type III-nitride layer and the n-type TJ insertion layer form a TJ.

Optionally, another LED can be grown on or above the n-type TJ insertion junction layer.

Block 511 represents the step of forming an n-type III-nitride layer; Block 512 represents the step of forming a III-nitride light emitting layer; Block 513 represents the step of forming a p-type III-nitride layer.

Block 514 represents the step of dry etching the device structure to expose access points and sidewalls; thermal annealing to activate the p-type III-nitride layers; and depositing contact layers or pads on the access points as well as the top of the device structure.

The end result is monolithic, cascaded, multiple color LEDs 100 with two or three emission colors that can be integrated into one die with independent junction control.

Experimental Results

The following describes experimental results obtained for the present invention.

The growth temperature for the blue InGaN quantum wells, green InGaN quantum wells, red InGaN quantum wells is 880° C., 800° C. and 760° C., respectively. In one embodiment, a stack comprised of 5 pairs of InGaN/GaN multiple quantum wells was used.

The n-type TJ insertion layer grown at a low temperature of 880° C.

A higher temperature of 1100° C. to 1250° C. was used for the growth of the n-type III-nitride layers.

Figure 6:
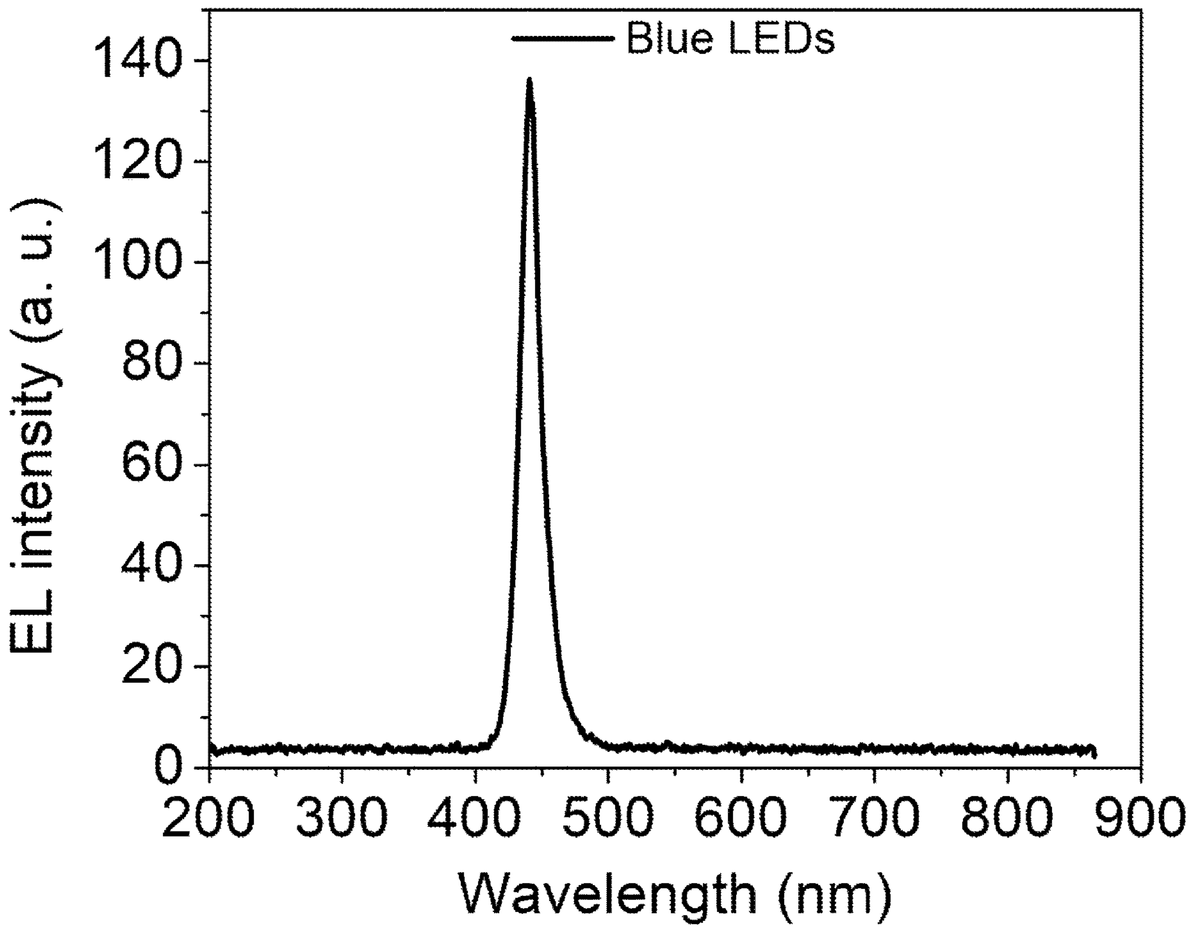
FIG. 6 is a plot of the spectra of blue LEDs at an injection current density of 20 $A/cm^2$.
Figure 7:
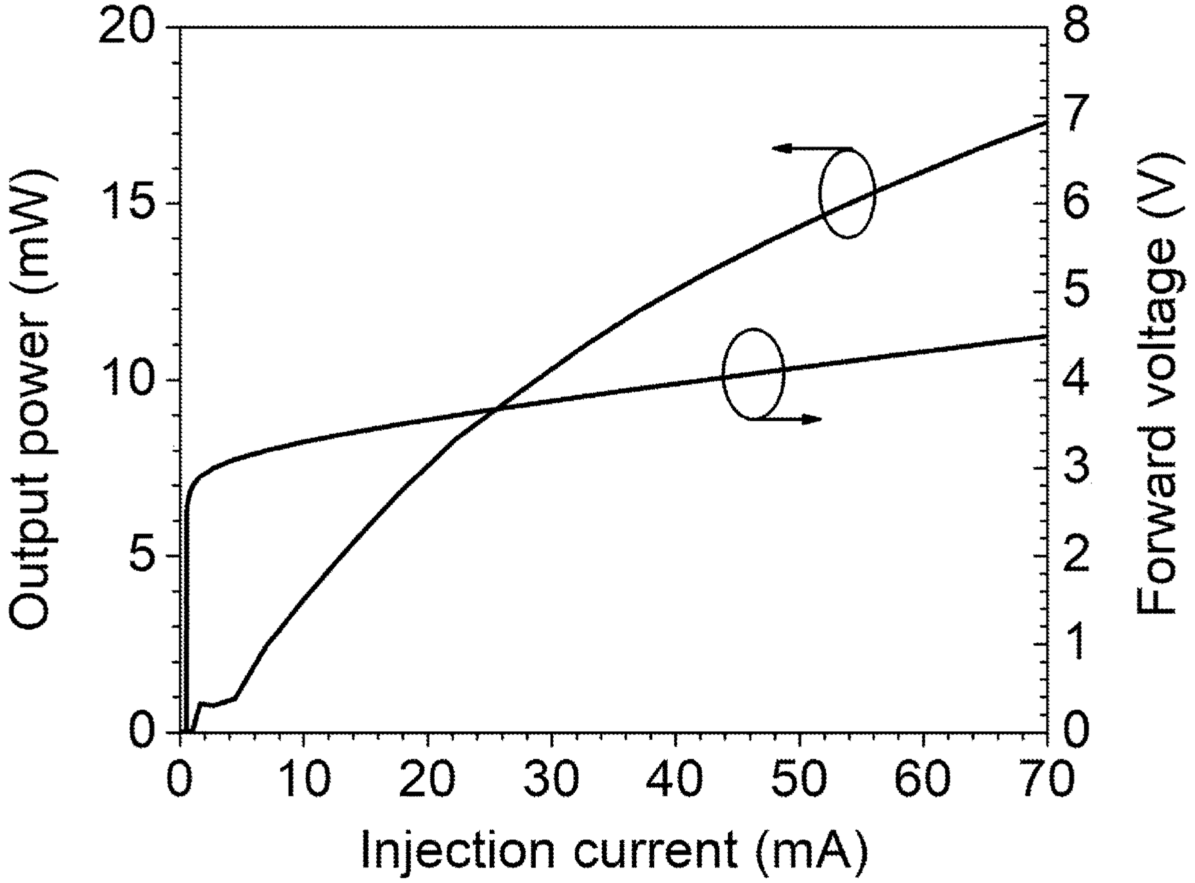
FIG. 7 is a plot of the output power-current-forward voltage of blue LEDs.

FIG. 6 is a graph of electroluminescence (EL) intensity (a.u.) vs. wavelength (nm) and FIG. 7 is a graph of output power (mW) and forward voltage (V) vs. injection current (mA) showing experimental results for blue LEDs fabricated using the present invention. Specifically, these graphs show the emission spectrum and the output power-current-forward voltage characteristic (LIV) curve for the blue LEDs. At 20 A/cm$^2$, the blue LED shows an emission peak wavelength of 460 nm, forward voltage of 3.8 V and an output power of 8 mW.

Figure 8:
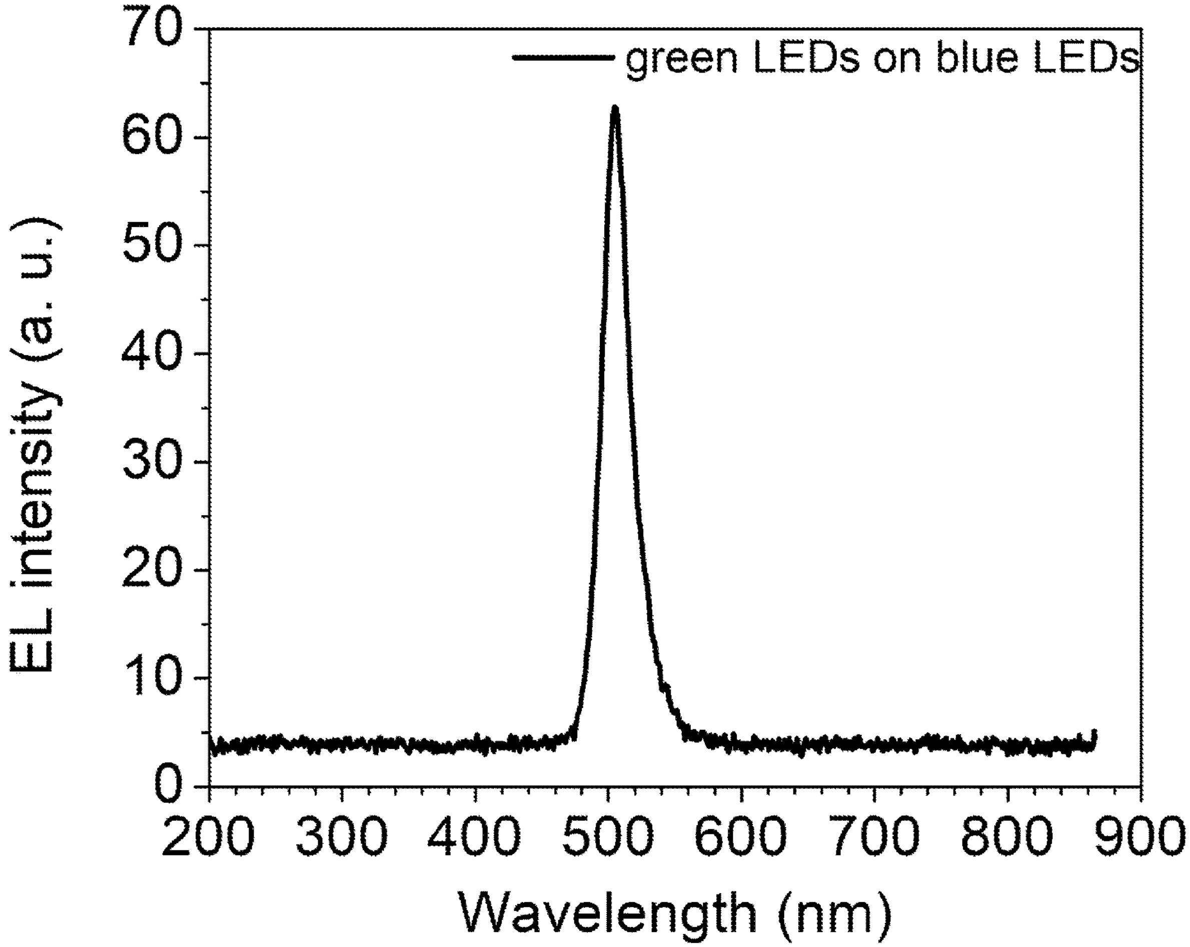
FIG. 8 is a plot of the spectra of green LEDs at an injection current density of 20 $A/cm^2$.
Figure 9:
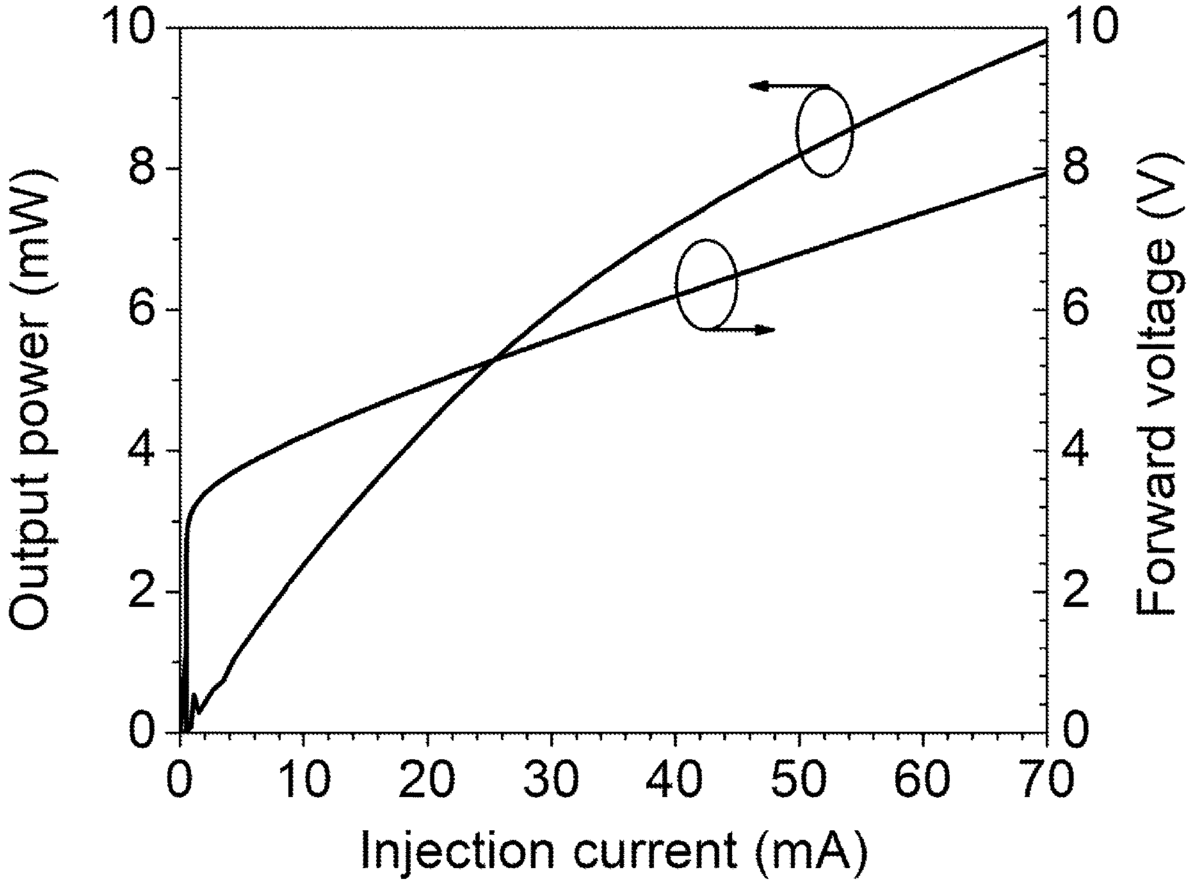
FIG. 9 is a plot of the output power-current-forward voltage of green LEDs.

FIG. 8 is a graph of electroluminescence (EL) intensity (a.u.) vs. wavelength (nm) and FIG. 9 is a graph of output power (mW) and forward voltage (V) vs. injection current (mA) showing experimental results for green LEDs fabricated on or above blue LEDs using the present invention. Specifically, these graphs show the emission spectrum and the output power-current-forward voltage characteristic (LIV) curve for the green LEDs grown on or above the blue LEDs. At 20 A/cm$^2$, the green LED shows an emission peak wavelength of 507 nm, forward voltage of 4.1 V and an output power of 4 mW.

Figure 10:
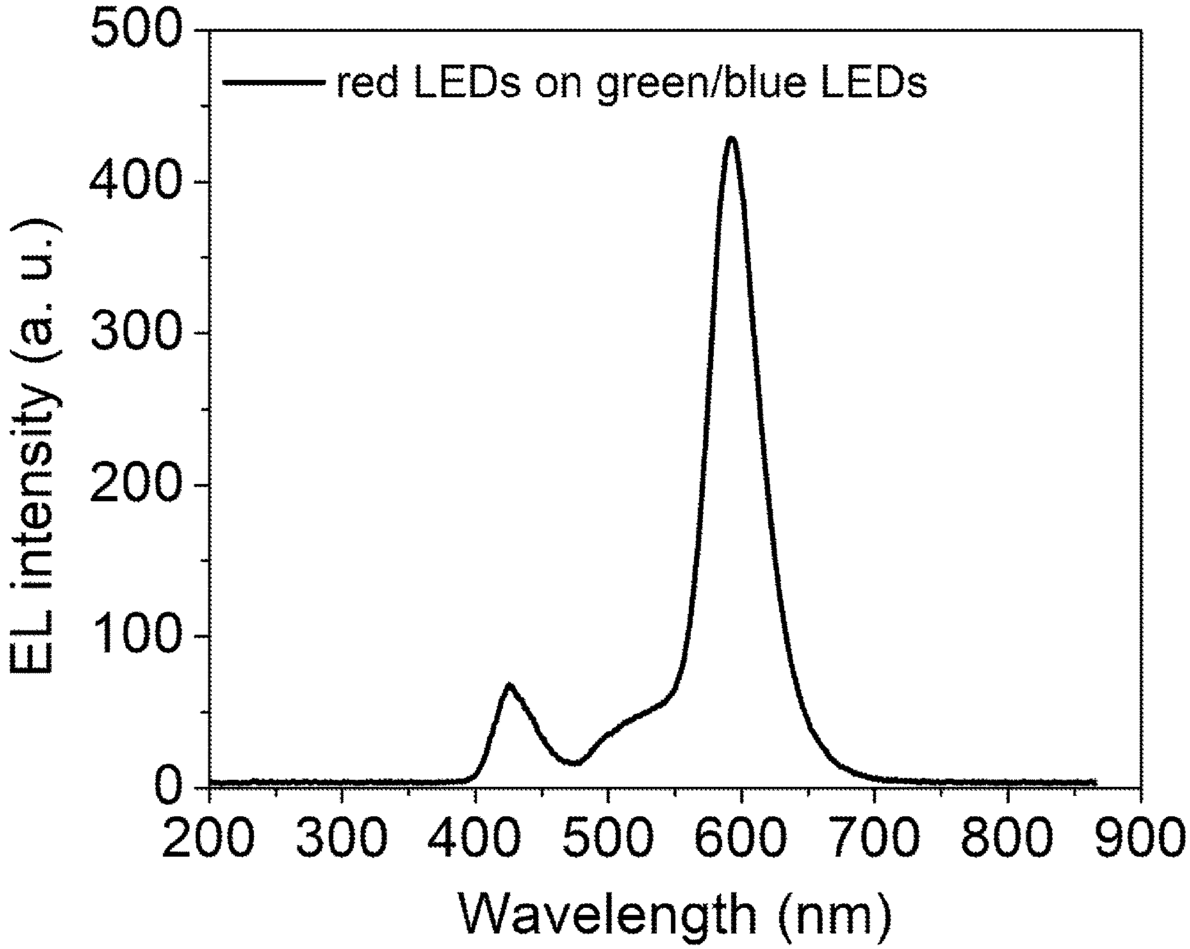
FIG. 10 is a plot of the spectra of red LEDs at an injection current density of 20 $A/cm^2$.
Figure 11:
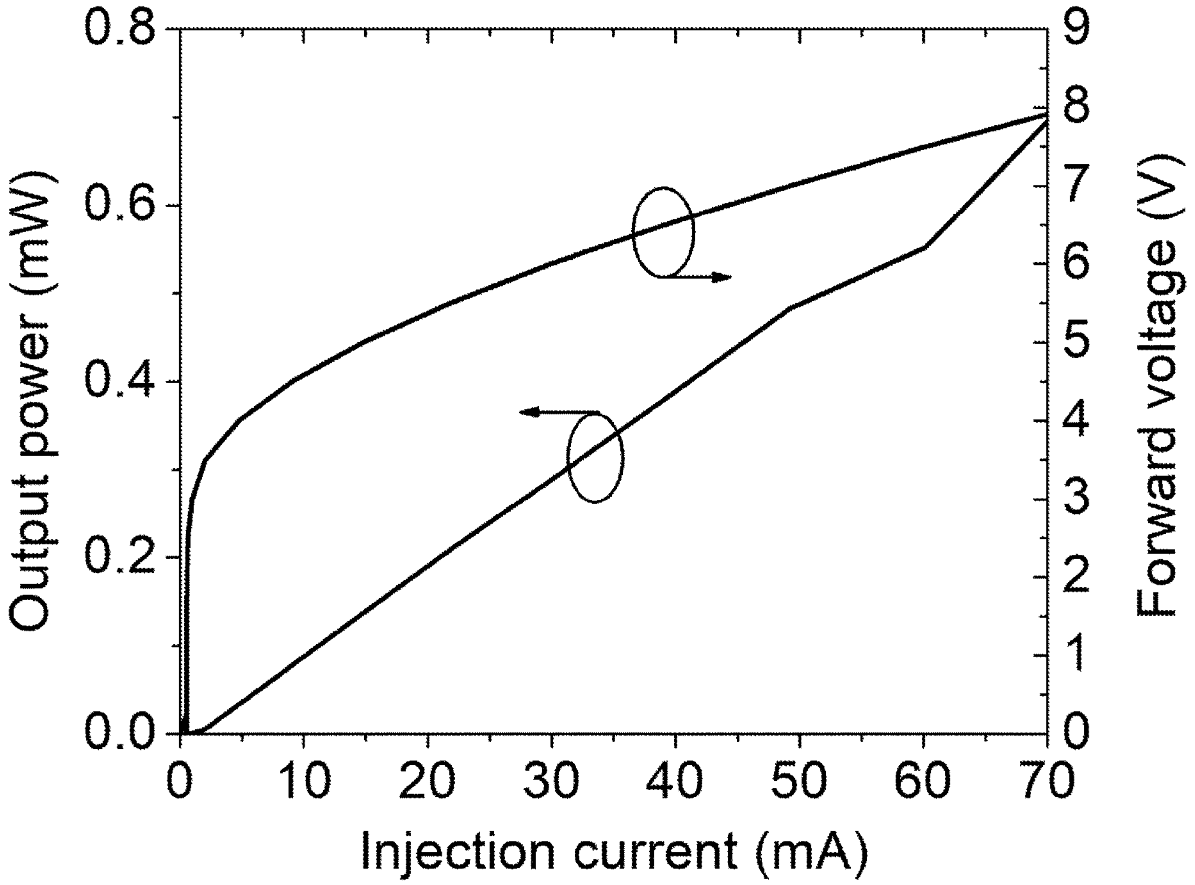
FIG. 11 is a plot of the output power-current-forward voltage of red LEDs.

FIG. 10 is a graph of electroluminescence (EL) intensity (a.u.) vs. wavelength (nm) and FIG. 11 is a graph of output power (mW) and forward voltage (V) vs. injection current (mA) showing experimental results for red LEDs fabricated on or above green/blue LEDs using the present invention. Specifically, these graphs show the emission spectrum and the output power-current-forward voltage characteristic (LIV) curve for the red LEDs grown on or above the green/blue LEDs. At 20 A/cm$^2$, the red LED shows an emission peak wavelength of 597 nm, forward voltage of 5.1 V and an output power of 0.24 mW.

Figure 12:
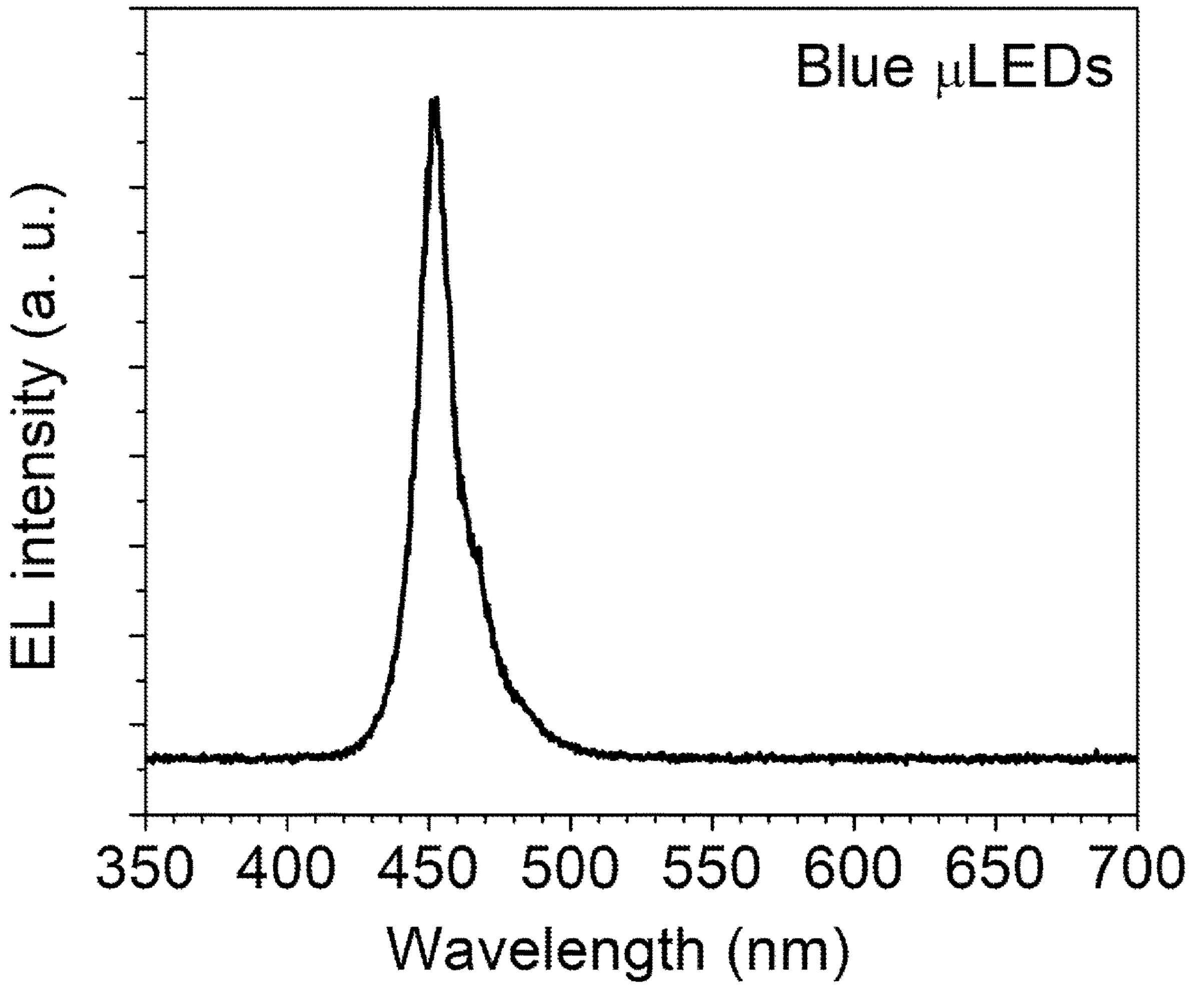
FIG. 12 is a plot of the spectra of blue micro-sized LEDs at an injection current density of 20 $A/cm^2$.
Figure 13:
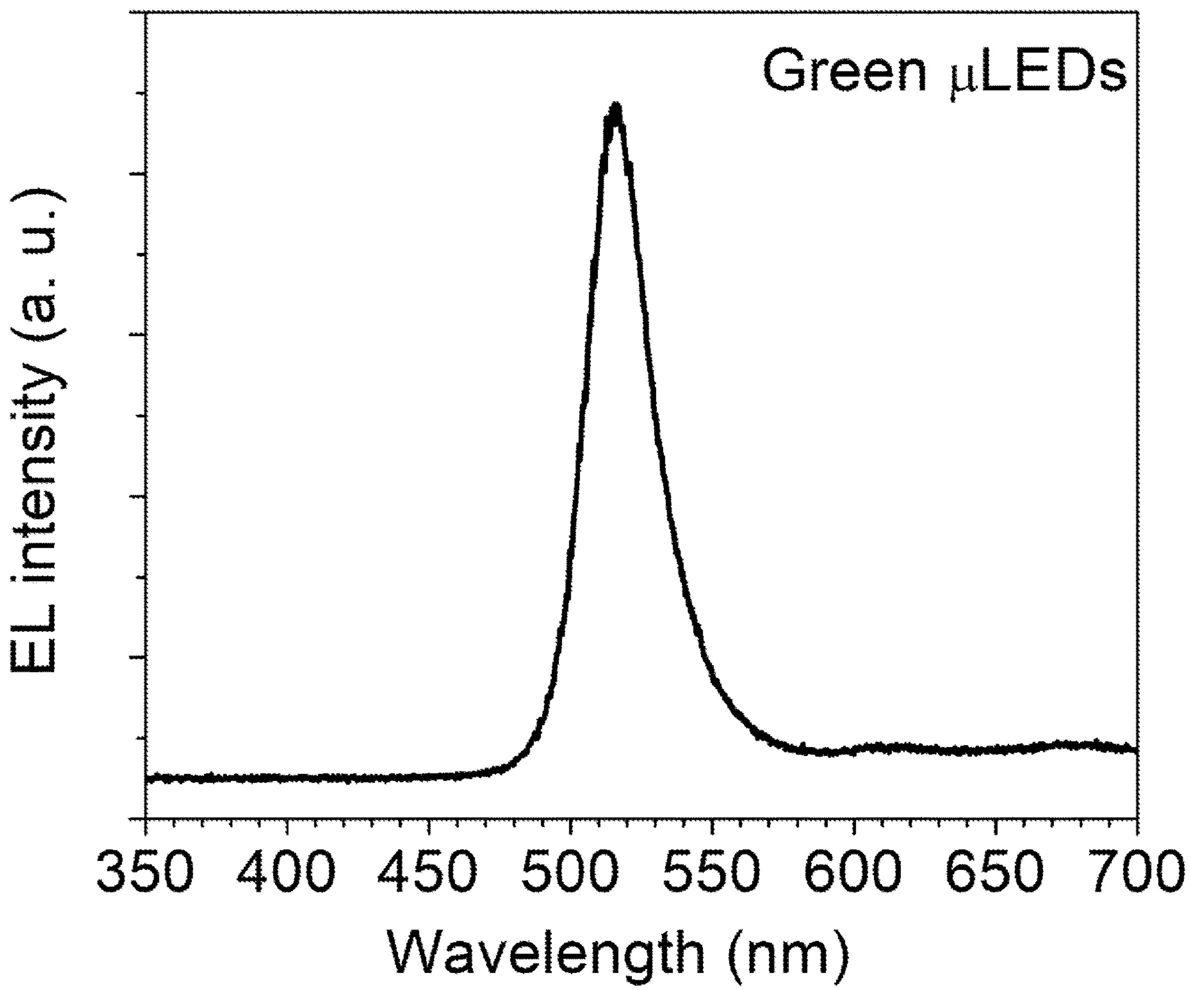
FIG. 13 is a plot of the spectra of green micro-sized LEDs at an injection current density of 20 $A/cm^2$.
Figure 14:
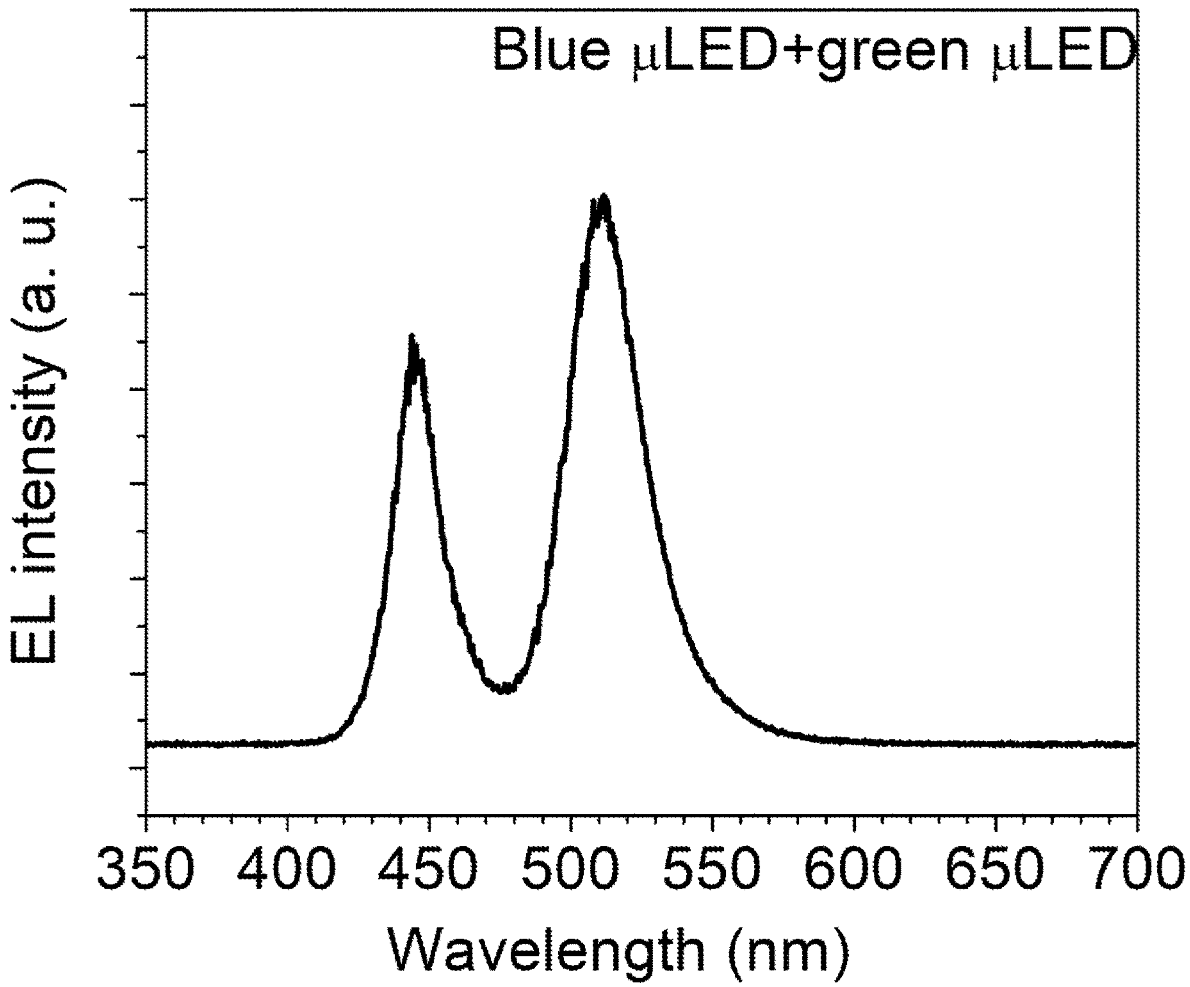
FIG. 14 is a plot of the spectra of blue and green micro-sized LEDs at an injection current density of 20 $A/cm^2$.

FIGS. 12, 13 and 14 are plots of the spectra of monolithic, cascaded, blue-green μLEDs fabricated using the present invention at an injection current density of 20 A/cm$^2$. By controlling the current injected through blue μLEDs, the emission spectrum is shown in FIG. 12; by controlling the current injected through green μLEDs, the emission spectrum is shown in FIG. 13; and by controlling the current injected through blue and green μLEDs, the emission spectrum is shown in FIG. 14. The results show that monolithic, cascaded, blue-green μLEDs with independent junction are achieved.

Figure 15:
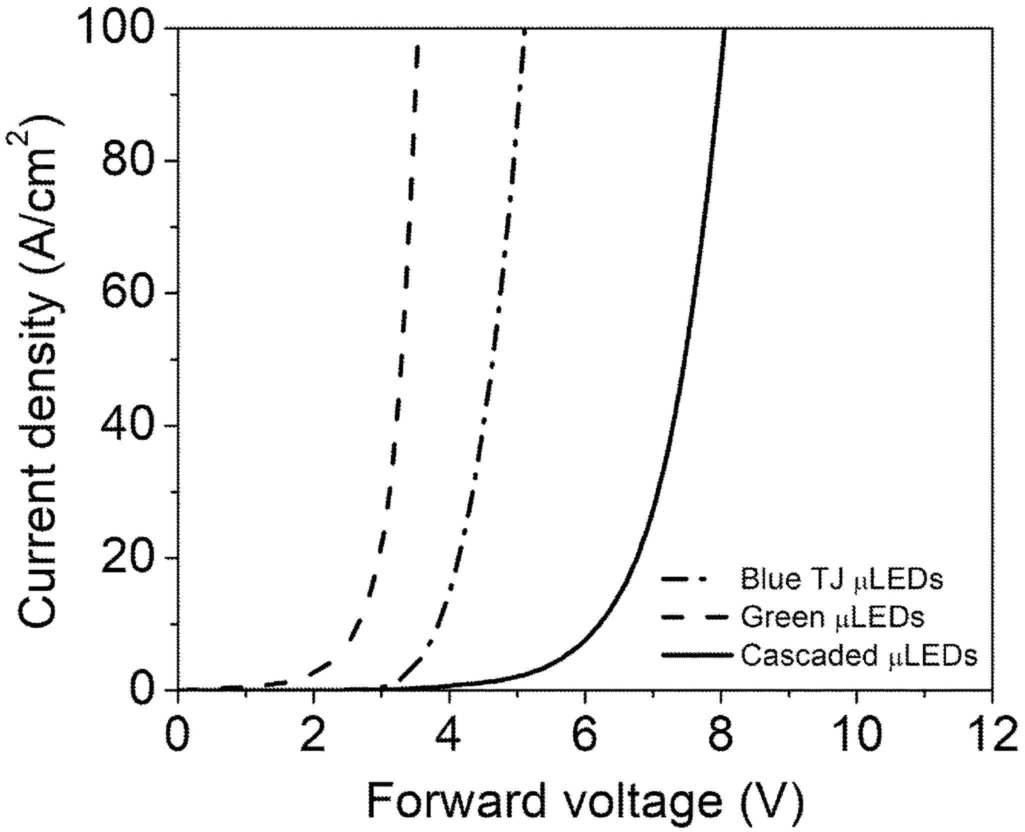
FIG. 15 is a plot of the voltage-current density of blue, green, and cascaded blue/green micro-sized LEDs.

FIG. 15 is a plot of the voltage-current density of blue, green, and cascaded blue/green μLEDs. Specifically, FIG. 15 shows the current density-voltage curves for the blue μLEDs, green μLEDs, and cascaded blue/green μLEDs. At 20 A/cm$^2$, the voltage is 2.9 V, 3.9 V and 4.7 V, respectively.

Alternatives and Modifications

The following describes possible alternatives and modifications to the present invention.

The n-type TJ insertion layer may be comprised of multiple films or layers having varying or graded compositions, a heterostructure comprising layers of dissimilar (Al, Ga, In, B) N composition, or one or more layers of dissimilar (Al, Ga, In, B) N composition. It can also be comprised of one or more films with various thickness, III-nitride compositions, and doping. These films may contain gallium, indium, aluminum, boron, or a combination thereof.

For example, in one embodiment, the n-type TJ insertion layer may be comprised of n-InGaN/n+GaN. However, in another embodiment, a TJ insertion layer comprised of comprised of p+GaN/n-InGaN/n+GaN may be used instead of the n-type TJ insertion layer.

The n-type TJ insertion layer may be comprised of unintentionally doped or intentionally doped films or layers, with elements such as iron, magnesium, silicon, oxygen, carbon, and/or zinc. The n-type TJ insertion layer may be grown using deposition methods comprising MOCVD, hydride vapor phase epitaxy (HVPE), or molecular beam epitaxy (MBE).

The structure may further comprise the n-type TJ insertion layer being grown utilizing selective area growth (SAG), which can further reduce the forward voltage. The tunnel junction structure may further comprise an n-type graded InGaN layer or p-type graded InGaN layer, which can further reduce the forward voltage.

In other embodiments, the method comprises repeating steps of so as to form multiple LEDs comprising 2 LEDs and 1 TJ, 3 LEDs and 2 TJs, or more than 3 LEDs and 2 TJs, wherein the TJs comprise an n-type TJ insertion layer formed on or above a p-type layer, and each buried n-type layer in the device is contacted, such that current flowing through each active region is controlled individually.

REFERENCES

The following publications are incorporated by reference herein:

[1] L. Esaki, "New Phenomenon in Narrow Germanium p-n Junctions," Phys. Rev., vol. 109, no. 2, pp. 603-604, January 1958.

[2] J. Simon, V. Protasenko, C. Lian, H. Xing, and D. Jena, "Polarization-induced hole doping in wide-band gap uniaxial semiconductor heterostructures," Science, vol. 327, no. 5961, pp. 60-4, January 2010.

[3] Panpan Li, Haojun Zhang, Hongjian Li, Yuewei Zhang, Yifan Yao, Nathan Palmquist, Mike Iza, James S Speck, Shuji Nakamura, Steven P DenBaars, "Metalorganic chemical vapor deposition grown n-InGaN/n–GaN tunnel junctions for micro-light-emitting diodes with very low forward voltage," Semiconductor Science and Technology, vol. 35, no. 12, p. 125023, 2020.

[4] S. Krishnamoorthy, F. Akyol, P. S. Park, and S. Rajan, "Low resistance GaN/InGaN/GaN tunnel junctions," Appl. Phys. Lett., vol. 102, no. 11, 2013.

[5] P. Li, H. Zhang, H. Li, M. Iza, Y. Yao, M. S Wong, N. Palmquist, J. S Speck, S. Nakamura, S. P DenBaars, "Size-independent low voltage of InGaN micro-light-emitting diodes with epitaxial tunnel junctions using selective area growth by metalorganic chemical vapor deposition", Optics Express, 28, 18707 (2020).

[6] P. Li, H. Li, H. Zhang, M. Iza, J. S Speck, S. Nakamura, S. P DenBaars, "Metalorganic chemical vapor deposition-grown tunnel junctions for low forward voltage InGaN light-emitting diodes: epitaxy optimization and light extraction simulation", Semiconductor Science and Technology, vol. 36, no. 3, p. 035019, 2021.

Nomenclature

The terms "III-nitride" or "nitride" as used herein refer to any composition or material related to (B, Al, Ga, In, Sc, Y) N semiconductors having the formula $B_uAl_vGa_wIn_xSc_yY_zN$ where 0≤u≤1, 0≤v≤1, 0≤w≤1, 0≤x≤1, 0≤y≤1, 0≤z≤1, and u+v+w+x+y+z=1. These terms as used herein are intended to be broadly construed to include respective nitrides of the single species, B, Al, Ga, In, Sc and Yn, as well as binary, ternary, quaternary, etc., compositions of such Group III metal species. Accordingly, these terms include, but are not limited to, the compounds of AlN, GaN, InN, AlGaN, AlInN, InGaN, AlGaInN, etc. When two or more of the (B, Al, Ga, In, Sc, Y) N component species are present, all possible compositions, including stoichiometric proportions as well as off-stoichiometric proportions (with respect to the relative mole fractions present of each of the (B, Al, Ga, In, Sc, Y) N component species that are present in the composition), can be employed within the broad scope of this invention. Further, compositions and materials within the scope of the invention may further include quantities of dopants and/or other impurity materials and/or other inclusional materials.

This invention also covers the selection of particular crystal orientations, directions, terminations and polarities of III-nitride materials. When identifying crystal orientations, directions, terminations and polarities using Miller indices, the use of braces, { }, denotes a set of symmetry-equivalent planes, which are represented by the use of parentheses, ( ) The use of brackets, [ ], denotes a direction, while the use of brackets, < >, denotes a set of symmetry-equivalent directions.

Many III-nitride devices are grown along a polar orientation, namely a c-plane {0001} of the crystal, although this results in an undesirable quantum-confined Stark effect (QCSE), due to the existence of strong piezoelectric and spontaneous polarizations. One approach to decreasing polarization effects in III-nitride devices is to grow the devices along nonpolar or semipolar orientations of the crystal.

The term "nonpolar" includes the {11-20} planes, known collectively as a-planes, and the {10-10} planes, known collectively as m-planes. Such planes contain equal numbers of Group-III and Nitrogen atoms per plane and are charge-neutral. Subsequent nonpolar layers are equivalent to one another, so the bulk crystal will not be polarized along the growth direction.

The term "semipolar" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the crystal will have reduced polarization along the growth direction.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What claimed is:

1. A device, comprising:

a plurality of monolithic, cascaded, multiple color, III-nitride light-emitting diodes (LEDs) with independent junction control, wherein:

each of the plurality of LEDs is comprised of at least an n-type III-nitride layer, a III-nitride emitting layer, and a p-type III-nitride layer;

adjacent LEDs of the plurality of LEDs are separated and electrically connected by a tunnel junction (TJ), wherein:

an n-type tunnel junction insertion layer is formed on the p-type III-nitride layer of a first one of the adjacent LEDs and the n-type III-nitride layer of a second one of the adjacent LEDs is formed on the n-type tunnel junction insertion layer;

the p-type III-nitride layer of the first one of the adjacent LEDs and the n-type tunnel junction insertion layer form the tunnel junction; and the p-type III-nitride layer of the first one of the adjacent LEDs is at least partially covered by the n-type tunnel junction insertion layer.

2. The device of claim 1, wherein the p-type III-nitride layer of the first one of the adjacent LEDs is at least partially exposed by etching to create one or more access points.

3. The device of claim 2, wherein the first one of the adjacent LEDs includes one or more contact layers or pads for injection of current that controls emission of the first one of the adjacent LEDs independently, wherein the contact layers or pads are deposited on one or more of the access points.

4. The device of claim 1, wherein the III-nitride emitting layer is comprised of one or more $In_xAl_yGa_zN$ quantum wells (QWs), where $x+y+z=1$, $0<x<1$, $0<y<1$, and $0<z<1$.

5. The device of claim 4, wherein an emission wavelength of each of the plurality of LEDs is controlled by an indium composition in the III-nitride emitting layer.

6. The device of claim 5, wherein the III-nitride emitting layer of each of the plurality of LEDs has a different indium composition and a different emission wavelength.

7. The device of claim 6, wherein the plurality of monolithic, cascaded, multiple color, III-nitride LEDs comprise blue and green LEDs or blue, green, and red LEDs.

8. The device of claim 1, wherein each of the plurality of LEDs are micro-sized LEDs.

9. The device of claim 8, wherein an emitting area of each of the plurality of LEDs is less than about 10,000 $\mu m^2$.

10. The device of claim 1, wherein the n-type III-nitride layer has a thickness greater than 2 μm.

11. The device of claim 1, wherein the p-type III-nitride layer has a thickness less than 1 μm.

12. The device of claim 1, wherein the n-type tunnel junction insertion layer has a thickness greater than 0.1 nm.

13. The device of claim 1, wherein at least one of the plurality of LEDs emits blue light having output power greater than 8 mW in condition 20 $A/cm^2$.

14. The device of claim 1, wherein at least one of the plurality of LEDs emits green light having output power greater than 4 mW in condition 20 $A/cm^2$.

15. The device of claim 1, wherein at least one of the plurality of LEDs emits red light having output power greater than 0.24 mW in condition 20 $A/cm^2$.

16. The device of claim 2, wherein the p-type III-nitride layer of the first one of the LEDs is activated by thermal annealing to remove hydrogen through sidewalls of the p-type III-nitride layer of the first one of the LEDs at least partially exposed by the etching.

17. The device of claim 3, wherein the one or more contact layers or pads are deposited on the p-type III-nitride layer of the first one of the LEDs, the n-type tunnel junction insertion layer, and the n-type III-nitride layer of the second one of the LEDs.

18. The device of claim 1, wherein the n-type tunnel junction insertion layer is comprised of n−InGaN/n+GaN.

19. The device of claim 18, wherein the n-type tunnel junction insertion layer is comprised of p+GaN/n−InGaN/n+GaN.

20. A method, comprising:

forming a plurality of monolithic, cascaded, multiple color, III-nitride light-emitting diodes (LEDs) with independent junction control, wherein:

each of the plurality of LEDs is comprised of at least an n-type III-nitride layer, a III-nitride emitting layer, and a p-type III-nitride layer;

adjacent LEDs of the plurality of LEDs are separated and electrically connected by a tunnel junction (TJ), wherein:

an n-type tunnel junction insertion layer is formed on the p-type III-nitride layer of a first one of the adjacent LEDs and the n-type III-nitride layer of a second one of the adjacent LEDs is formed on the n-type tunnel junction insertion layer;

the p-type III-nitride layer of the first one of the adjacent LEDs and the n-type tunnel junction insertion layer form the tunnel junction; and the p-type III-nitride layer of the first one of the adjacent LEDs is at least partially covered by the n-type tunnel junction insertion layer.

* * * * *